United States Patent
Touzelbaev et al.

(10) Patent No.: US 8,034,662 B2
(45) Date of Patent: Oct. 11, 2011

(54) THERMAL INTERFACE MATERIAL WITH SUPPORT STRUCTURE

(75) Inventors: Maxat Touzelbaev, San Jose, CA (US);
Gamal Refai-Ahmed, Markham (CA);
Yizhang Yang, Sunnyvale, CA (US);
Bryan Black, Spicewood, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/406,271

(22) Filed: Mar. 18, 2009

(65) Prior Publication Data

US 2010/0237496 A1 Sep. 23, 2010

(51) Int. Cl.
*H01L 21/44* (2006.01)
*H01L 21/48* (2006.01)
*H01L 21/50* (2006.01)

(52) U.S. Cl. ......... 438/109; 438/121; 438/106; 438/125

(58) Field of Classification Search .................. 438/108, 438/121, 118, 122, 119, 106, 109, 111, 112, 438/107, 113, 123, 124, 125, 126, 127; 257/777
See application file for complete search history.

(56) References Cited

U.S. PATENT DOCUMENTS

| | | | |
|---|---|---|---|
| 5,940,687 A | 8/1999 | Davis et al. | |
| 6,043,110 A * | 3/2000 | Davis et al. | 438/118 |
| 7,750,455 B2 * | 7/2010 | Pagaila et al. | 257/686 |
| 2007/0141378 A1 | 6/2007 | Pacheco et al. | |
| 2008/0093733 A1 * | 4/2008 | Hsu | 257/722 |

FOREIGN PATENT DOCUMENTS

| | | |
|---|---|---|
| GB | 2345577 A | 7/2000 |
| WO | WO2005053021 A2 | 6/2005 |

OTHER PUBLICATIONS

Arthur Keigler et al.; *Copper Deposition for Pillars and Vias*; Semiconductor Manufacturing Magazine; vol. 7, Issue 8; Aug. 2006; pp. 1-6.
PCT/US2010/024589 International Search Report.

* cited by examiner

*Primary Examiner* — Chuong A. Luu
(74) *Attorney, Agent, or Firm* — Timothy M. Honeycutt

(57) ABSTRACT

Various semiconductor chip thermal interface material methods and apparatus are disclosed. In one aspect, a method of establishing thermal contact between a first semiconductor chip and a heat spreader is provided. The method includes placing a thermal interface material layer containing a support structure on the first semiconductor chip. The heat spreader is positioned proximate the thermal interface material layer. The thermal interface material layer is reflowed to establish thermal contact with both the first semiconductor chip and the heat spreader.

19 Claims, 5 Drawing Sheets

THERMAL INTERFACE MATERIAL WITH SUPPORT STRUCTURE

BACKGROUND OF THE INVENTION

1. Field of the Invention

This invention relates generally to semiconductor processing, and more particularly to thermal interface material layers useful for semiconductor chip thermal management and methods of making and using the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

A solder thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing.

To establish favorable thermal contact between a conventional solder thermal interface material and the semiconductor chip and lid that bracket it, a reflow process is performed to wet the applicable surfaces. The goal is to achieve a relatively uniform bond line thickness after the reflow. However, the combination of the package substrate, the die, the solder and the lid behave dynamically during reflow due to differences in coefficients of thermal expansion and structural imperfections. Indeed the upper surface of the die may be non-uniform. This non-uniformity combined with irregular thermal warping can squeeze the thermal interface solder laterally, causing thin spots or even voids.

The present invention is directed to overcoming or reducing the effects of one or more of the foregoing disadvantages.

SUMMARY OF THE INVENTION

In accordance with one aspect of the present invention, a method of manufacturing is provided. The method includes placing a support structure in a thermal interface material layer. The thermal interface material layer is placed on a first semiconductor chip.

In accordance with another aspect of the present invention, a method of establishing thermal contact between a first semiconductor chip and a heat spreader is provided. The method includes placing a thermal interface material layer containing a support structure on the first semiconductor chip. The heat spreader is positioned proximate the thermal interface material layer. The thermal interface material layer is reflowed to establish thermal contact with both the first semiconductor chip and the heat spreader.

In accordance with another aspect of the present invention, an apparatus is provided that includes a first semiconductor chip. A thermal interface material layer is positioned on the semiconductor chip. The thermal interface material layer contains a support structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip with a reinforced thermal interface material are described herein. One example includes a solder thermal interface material layer that has an embedded support structure. The support structure can fix a bond line thickness and restrain lateral migration of solder during reflow. Additional details will now be described.

Figure 1:
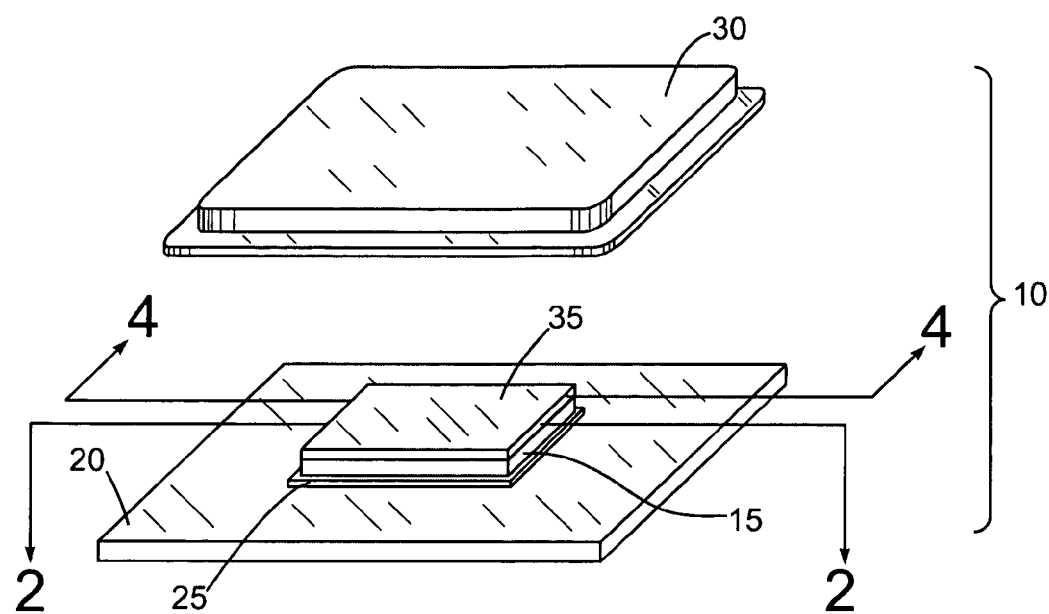
FIG. 1 is a partially exploded pictorial view of an exemplary embodiment of a semiconductor chip package that includes a semiconductor chip mounted on a package substrate or carrier.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip package 10 that includes a semiconductor chip 15 mounted on a package substrate or carrier 20. An underfill material 25 is interposed between the semiconductor chip 15 and the package substrate 20. A small portion of the underfill material 25 is visible in FIG. 1. The package 10 may be provided with a heat spreader or lid 30 that is designed to seat on the package substrate 20. In order to establish good thermal contact between the semiconductor chip 15 and the overlying lid 30, a solder composition thermal interface material layer 35 is placed on the semiconductor chip 15. A subsequent reflow process is performed after the lid 30 is positioned on the substrate 20 to establish a good metallurgical bond.

The semiconductor chip 15 may be flip-chip mounted to the substrate 20 as shown and electrically connected to conductors in the substrate 20 by interconnects that are not visible in FIG. 1 but will be shown in subsequent figures. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core. The semiconductor chip 15 may be fabricated using silicon, germanium or other semiconductor materials. If desired, the chip 15 may be fabricated as a semiconductor-on-insulator substrate or as bulk semiconductor. The semiconductor chip 15 may be electrically interconnected with the substrate 20 by a plurality of conductor structures that are not visible in FIG. 1.

The substrate 20 may be composed of ceramics or organic materials as desired. If organic, the substrate 20 may actually consist of multiple layers of metallization and dielectric materials that electrically interconnect the semiconductor chip 15 to some other component, such as a board (not shown). The substrate 20 may interconnect electrically with external devices, such as another circuit board, in a variety of ways, such as via a pin grid array, a land grid array, a ball grid array or other configuration. The number of individual layers for the substrate 20 is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill. Of course, the substrate 20 could be configured as something other than a package substrate, such as a printed circuit board serving as a motherboard, a daughter board, a card or some other type of board.

The underfill material 25 is designed to lessen the effects of differences in CTE between the chip 15 and the substrate 20. The underfill material 30 may be composed of well-known epoxy materials, such as epoxy resin with or without silica fillers and phenol resins or the like.

The lid 30 may be configured as a top hat design as disclosed, as a bathtub design or some other configuration that functions as a heat spreader. The lid 30 may be composed of well-known plastics, ceramics or metallic materials as desired. Some exemplary materials include nickel plated copper, anodized aluminum, aluminum-silicon-carbon, aluminum nitride, boron nitride or the like. The lid 30 may be secured to the substrate 20 by an adhesive composed of a well-known thixotropic adhesive or other well-known type of package adhesive as desired. If wettability with the thermal interface material 35 to the lid 30 is a concern, an undersurface of the lid 30 (not visible in FIG. 1) may be provided with a wetting film. The same is true for the upper surface of the semiconductor chip 15. For example, a gold film will readily wet an indium thermal interface material 35.

Figure 2:
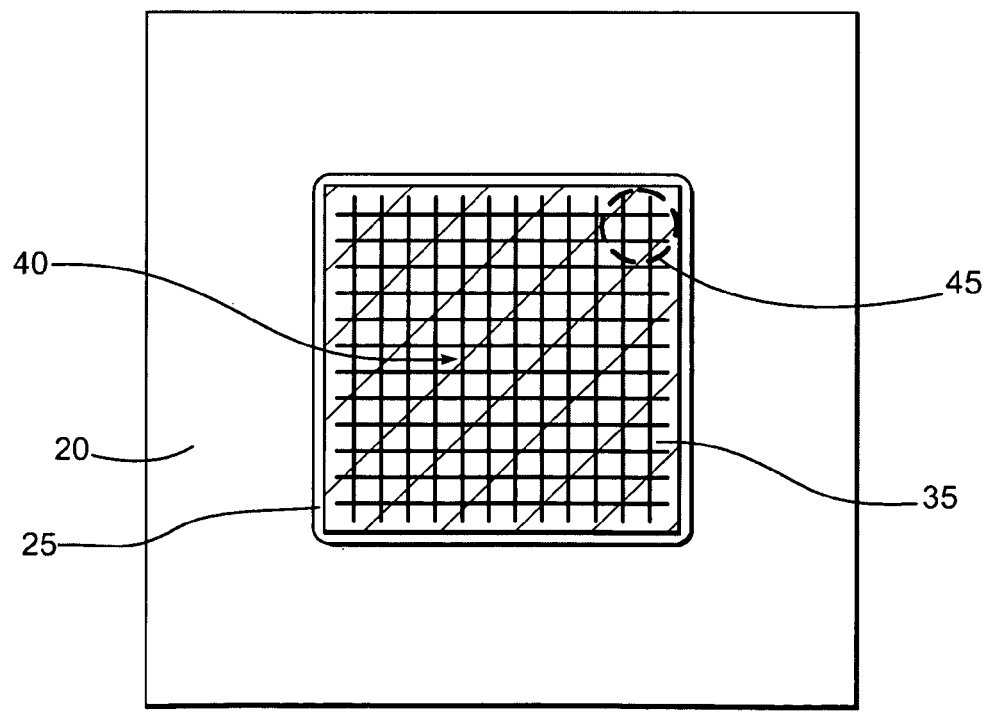
FIG. 2 is a sectional view of FIG. 1 taken at section 2-2.

As shown in subsequent figures and described in more detail below, the thermal interface material 35 is provided with an embedded support structure that is designed to prevent irregularities in the surface geometry of the semiconductor chip 15 and/or the underlying surfaces of the lid 30 and/or irregular pressures from thinning the thermal interface material 35 below desired minimum thickness. The embedded support structure will be visible in FIG. 2 which is a sectional view of FIG. 1 taken at section 2-2. Note that section 2-2 is taken through the thermal interface material 35 at a location such that the embedded support structure will be visible in FIG. 2. With that back drop, attention is now turned to FIG. 2. In this illustrative embodiment, the support structure 40 may be fabricated as a mesh that is embedded in the thermal interface material 35. The support structure 40 may be fabricated from a variety of materials. Good thermal conductivity and a melting point higher than that of the solder material used for the thermal interface material 35 are desirable properties. Exemplary materials include, for example, nickel, gold, platinum, silver, palladium, copper, aluminum, combinations of these or the like. The thermal interface material 35 may be composed of solder materials such as indium, tin, tin-silver, or other solder materials.

Figure 3:
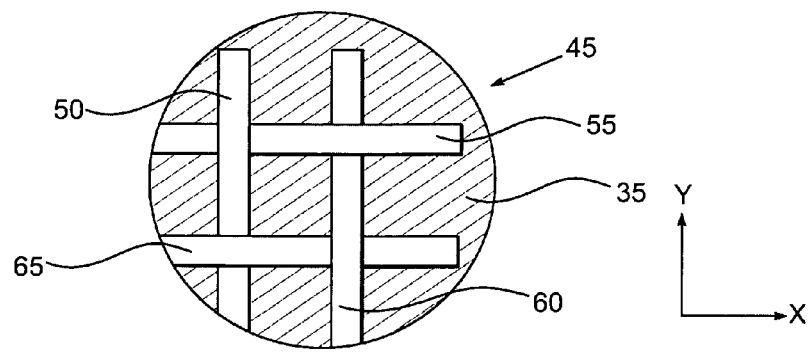
FIG. 3 is a portion of FIG. 2 shown at greater magnification.

To illustrate additional details of the support structure 40, a small portion circumscribed by the dashed circle 45 will be shown at greater magnification in FIG. 3. Attention is now turned to FIG. 3, which, as just noted is a portion of FIG. 2 circumscribed by the dashed oval 45 shown at greater magnification. Thus, a few pieces of the support structure 40 are visible in FIG. 3, namely, strands 50, 55, 60 and 65. It should be understood that the strands 50, 55, 60 and 65 are not shown in true section, but are instead shown as an overhead view with the overlying and surrounding thermal interface material 35 cut away. The strands 50, 55, 60 and 65 may be fabricated as metallic wires woven in a mesh pattern. When fabricated as a mesh structure, the support structure 40 provides several advantages. One advantage is a large surface area that will, by way of surface tension, resist the lateral movement of the thermal interface material 35 during reflow in for example the X-Y plane. In this way, the thermal interface material 35 is discouraged from flowing outward and away from the semiconductor chip 15 shown in FIG. 1 during a reflow process. The goal is to maintain as much thermal interface material as possible between the semiconductor chip 15 and the overlying lid 30 during reflow. The number, spacing and weave of the strands 50, 55, 60 and 65 may be varied.

An additional benefit will be described in conjunction with FIG. 4, which is a sectional view of FIG. 1 taken at section 4-4. Before turning to FIG. 4 in detail, it should be recalled that section 4-4 of FIG. 1 is taken through one edge of the thermal interface material 35. With that back drop, attention is now turned to FIG. 4. Additional details of a semiconductor chip package 10 are now visible in FIG. 4, such as a ball grid array 70 that is connected to a lower surface 75 of the semiconductor chip package substrate 20. It should be understood that a myriad of different types of interconnect schemes other than a ball grid array may be used such as a pin grid array, a land grid array or some other type of interconnect system. The semiconductor chip 15 may be flip-chip mounted to the package substrate 20 and electrically interconnected thereto by way of a plurality of interconnects collectively labeled 80. The interconnects 80 may be solder joints, conductive pillars, a combination of these or some other form of interconnect. The thermal interface material 35 and support structure 40 are shown exaggerated in size relative to the semiconductor chip 15 for clarity of illustration. A portion of the overlying lid 30 is visible in FIG. 4 as well as the underfill material 25. Because of the location of section 4-4, a single strand 85 of the support structure 40 that is oriented along an axis 90 is visible along with a plurality of interwoven strands, two of which are labeled 95 and 100 respectively that are oriented along an axis that is not labeled but which projects in and out of the page. The thermal interface material 35 has some average thickness $Z_1$. The support structure 40 has a thickness, $Z_2$, and is positioned at some vertical position within the thermal interface material 35 along a Z-axis. The thickness $Z_2$ is advantageously less than the initial thickness $Z_1$ of the thermal interface material 35. This thickness differential is desirable because during a reflow process to establish metallurgical bonding of the thermal interface material 35 to the backside 105 of the semiconductor chip 15 and the underside 110 of the lid 30, it is important that there be maximum wetting between the thermal interface material 35 and the surfaces 105 and 110.

Figure 4:
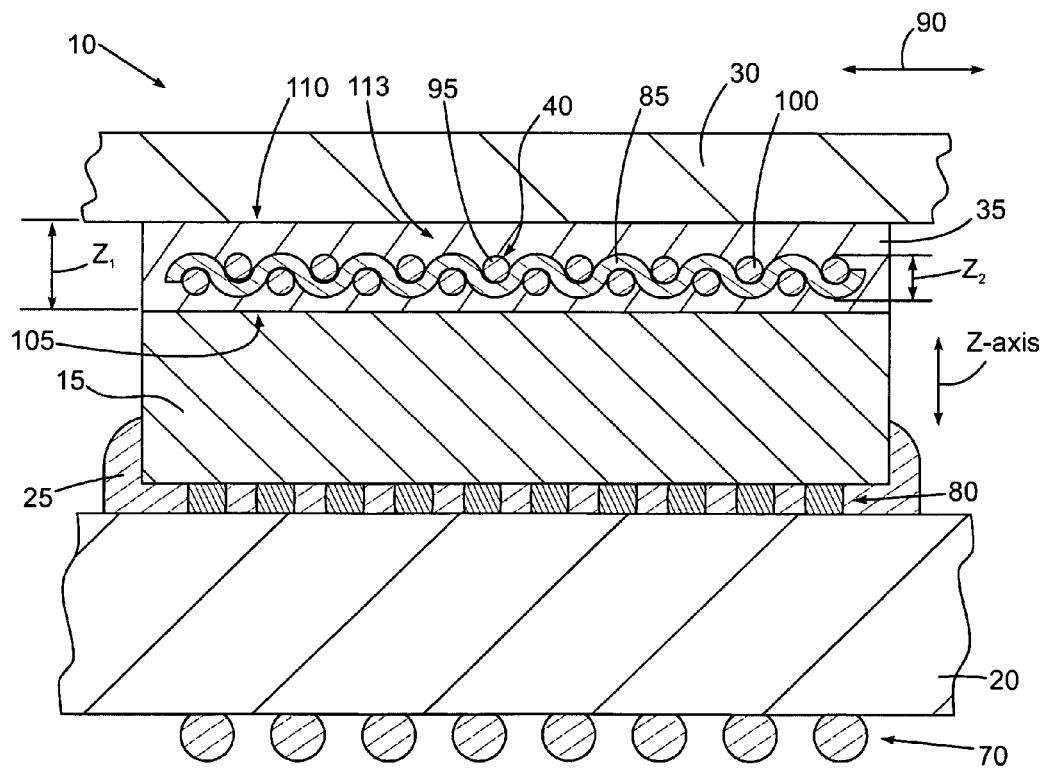
FIG. 4 is a sectional view of FIG. 1 taken at section 4-4.

FIG. 4 represents an ideal situation in which the thickness $Z_1$ of the thermal interface material 35 is above some minimum design specification. However, if irregularities in the backside 105 of the semiconductor chip 15 and/or the lower surface 110 of the lid 30 are significant enough and/or there are asymmetric forces imposed by the lid 30 on the thermal interface material 35 during a subsequent thermal cycle, such as a reflow for the ball grid array 70, then there is the possibility of thermal interface material 35 leaching or being squeezed out to produce a void in the region 113 above the semiconductor chip 15. However, the presence of the support structure 40 results in the minimum thickness of the thermal interface material 35 being at least the thickness $Z_2$ of the support structure 40. This follows from the fact that if the lid 30 is compressed either symmetrically or asymmetrically against the thermal interface material 35, at some point the support structure 40 will bottom out against the semiconductor chip surface 105 and top out against the lower surface 100 of the lid 30 and prevent any further compression of a thermal interface material 35 during reflow. As noted above, the large surface area of the support structure 40 will restrict the lateral movement of the thermal interface material 35 through surface tension.

Figure 5:
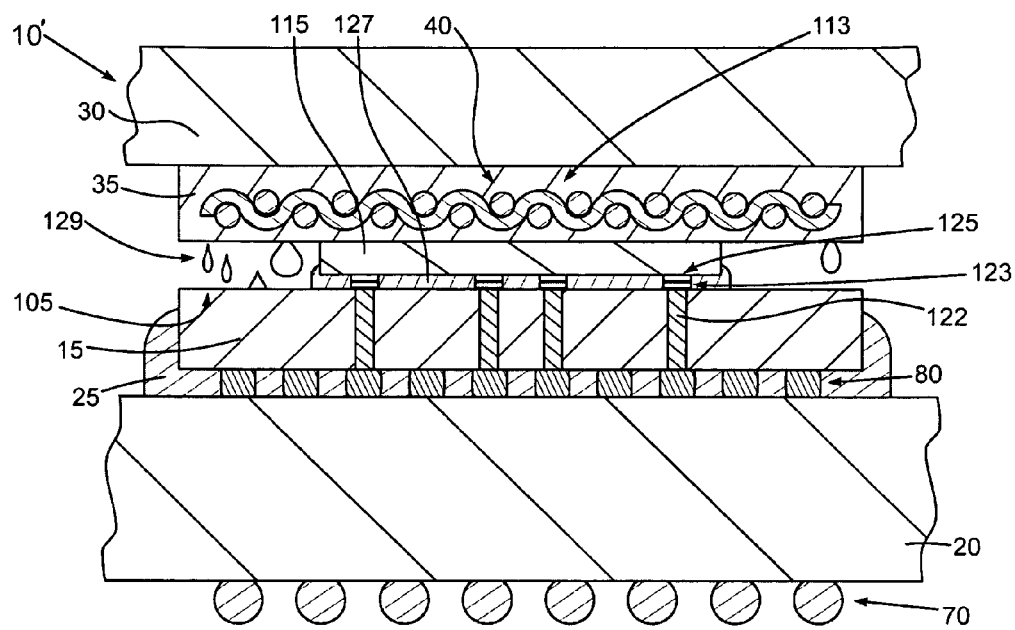
FIG. 5 is a sectional view like FIG. 4 but depicting thermal interface material reflow for an alternate exemplary embodiment of a semiconductor chip package.

The support structures disclosed herein may be particularly useful in semiconductor chip packages that incorporate stacked chips. The chip stacking process can lead to irregularities in the elevation of the top-most chip in the stack which can produce asymmetric thicknesses in the thermal interface material. A stacked chip embodiment is shown in FIG. 5, which is a sectional view like FIG. 4. An exemplary package 10' may be substantially identical to the chip package 10 depicted in FIGS. 1 and 4 with a few notable exemptions. The substrate 20, underfill 25, lid 30, ball grid array 70, and solder joint array 80 may be substantially as described above. However, in this illustrative embodiment another semiconductor chip 115 is stacked on the semiconductor chip 15. The second semiconductor chip 115 may be any of the circuit devices described elsewhere herein. The second semiconductor chip 115 may be electrically connected to the substrate 20 by way of a plurality of interconnects 120 which may be through-silicon interconnects, solder joints, or some other type of interconnect. In this illustrative embodiment, the interconnects are formed as through-silicon interconnects that consist of a through-silicon via 122 that connects electrically at one end to one of the solder joints 80 and at the another end to a conductor pad 123. A matching conductor pad 125 is coupled to the semiconductor chip 115 and bonded to the conductor pad 123. The matching conductor pads 123 and 125 may be composed of various conductor materials, such as gold, silver, platinum or the like. If composed of gold, the pads 123 and 125 may be diffusion bonded together. The through-silicon via may be composed of copper, nickel, gold, platinum, silver, palladium, aluminum, combinations of these or the like. More than two chips may be used in the stack. An underfill 127 like the underfill 25 may be placed between the semiconductor chips 15 and 115.

In this illustrative embodiment, the semiconductor chip 115 may have a smaller footprint than the underlying semiconductor chip 15. With this stacked arrangement, it is still desirable to establish heat transfer pathways between the semiconductor chip 15 and the lid 30. Therefore it is important that the thermal interface material 35 wet the upper surface 105 of the semiconductor chip 15 during a thermal interface material reflow process. FIG. 5 depicts the thermal interface material 35 at the commencement of the reflow. As the thermal interface material 35 melts, drops 129 dribble down to and wet the surface 105. This movement of thermal interface material 35 is necessary. However, it is preferred that the movement of the drops 129 not deplete the region 113 above the semiconductor chip 115 and cause voids. The embedded support structure 40 resists movement of the thermal interface material 35 from the region 113 through surface tension.

Figure 6:
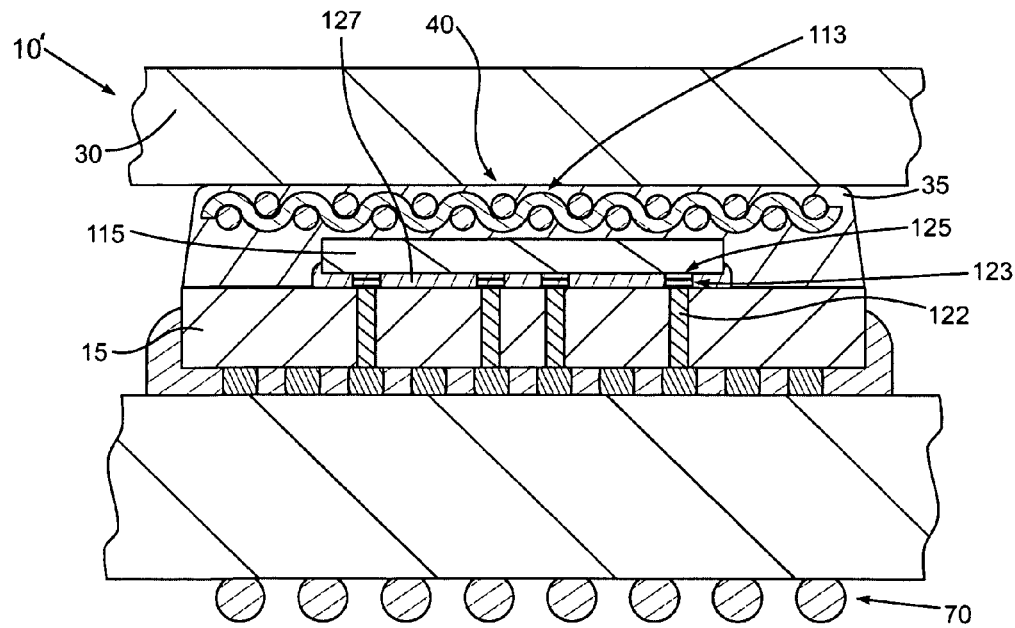
FIG. 6 is a sectional view like FIG. 5 depicting post reflow.

FIG. 6 depicts the package 10' after thermal interface material reflow. The thermal interface material 35 now wets the semiconductor chip 15 and the semiconductor chip 115 to establish a thermally conductive pathway to the lid 30. The support structure 40 has prevented depletion of thermal interface material in the region 113 and will continue to serve that function if a subsequent thermal cycle, such as a reflow of the ball grid array 70 is performed. The underfill 127 prevents undesirable wetting between the semiconductor chips 15 and 115 that might otherwise short the pads 123 and 125 and via 122.

It should be understood that the semiconductor chip 115 may have the same general footprint as the underlying semiconductor chip 15. In this circumstance, the upper surface 105 of the semiconductor chip 15 would be largely covered by the semiconductor chip 115 and little thermal interface material could wet the surface 105. However, heat transfer from the semiconductor chip 15 to the semiconductor chip 115 and ultimately the thermal interface material 35 may be facilitated by the through-silicon interconnects, particularly where through-silicon vias 122 and pads 123 and 125 are thermally conductive and make up a sufficient percentage of the footprint of the semiconductor chip 15.

Figure 7:
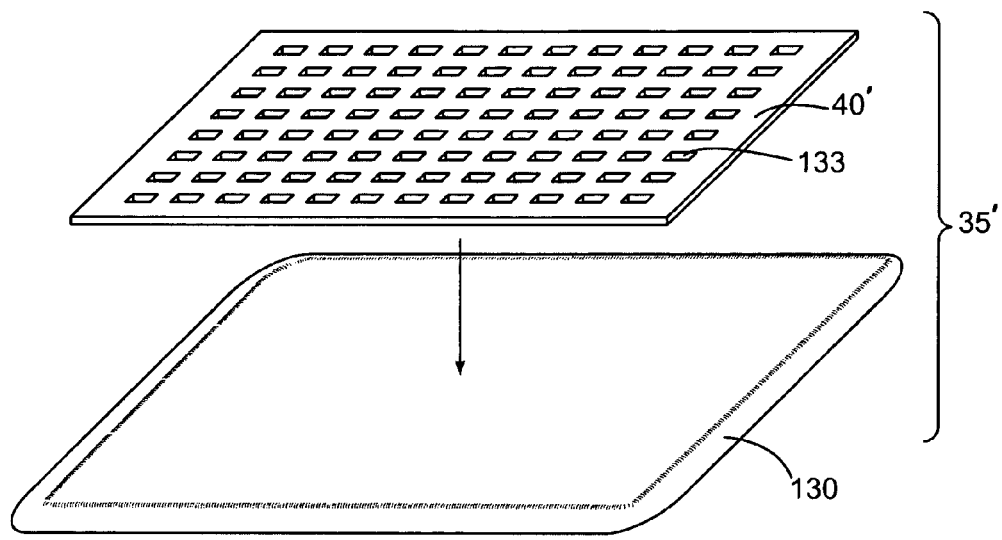
FIG. 7 is an exploded pictorial view of an alternate exemplary thermal interface material layer.

In the foregoing illustrative embodiment, the support structure 40 is fabricated as a wire mesh. However, other types of structures may be used. In this regard, attention is now turned to FIG. 7, which is an exploded pictorial view of a thermal interface material layer 35' that includes a thermal interface material preform 130 and a support structure 40' that is embedded therein. The thermal interface material preform 130 may be fabricated from the types of solder materials disclosed elsewhere herein. In this illustrative embodiment, the support structure 40' is fabricated from a sheet of metallic materials such as the metallic materials disclosed elsewhere herein for the support structure 40. The sheet is provided with a plurality of holes, one of which is labeled 133. The array of holes 133 may be cut, stamped, etched, drilled or otherwise formed. Like the other illustrative embodiments disclosed herein, the support structure 40 with the array of holes 133 provides not only a minimum thickness for the thermal interface material 35' but also inhibits the lateral flow of the thermal interface material preform 130 during a subsequent reflow via surface tension.

The support structure 40 may be imbedded in the thermal interface material preform 130 in a variety of ways. In one illustrative embodiment, the preform 130 is temporarily brought to a liquid state and the support structure 40 is embedded therein and the preform 130 is allowed to cool. However, other techniques may be used as well.

Figure 8:
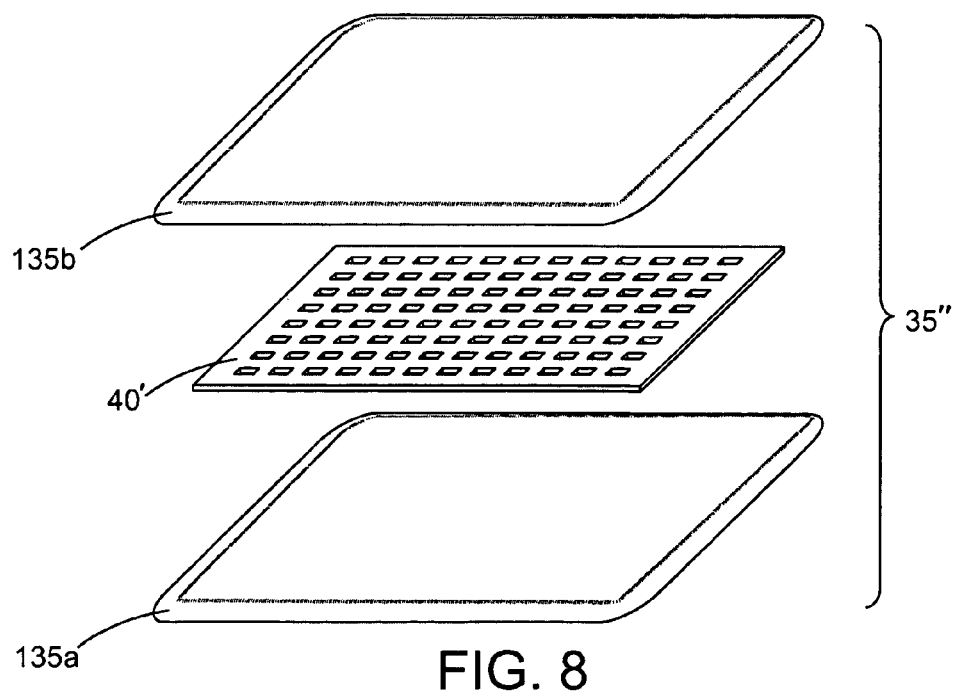
FIG. 8 is an exploded pictorial view of another alternate exemplary thermal interface material layer.

FIG. 8 is an exploded pictorial of another exemplary thermal interface material layer 35". In this illustrative embodiment, the embedding process involves sandwiching the support structure 40' between two preforms 135a and 135b. At this stage, a reflow may be preformed to fuse the preforms 135a and 135b into a single thermal interface material layer 35" with the support structure 40' positioned therein. This technique may also be used for the wire mesh embodiment of the support structure 40 described elsewhere herein.

Figure 9:
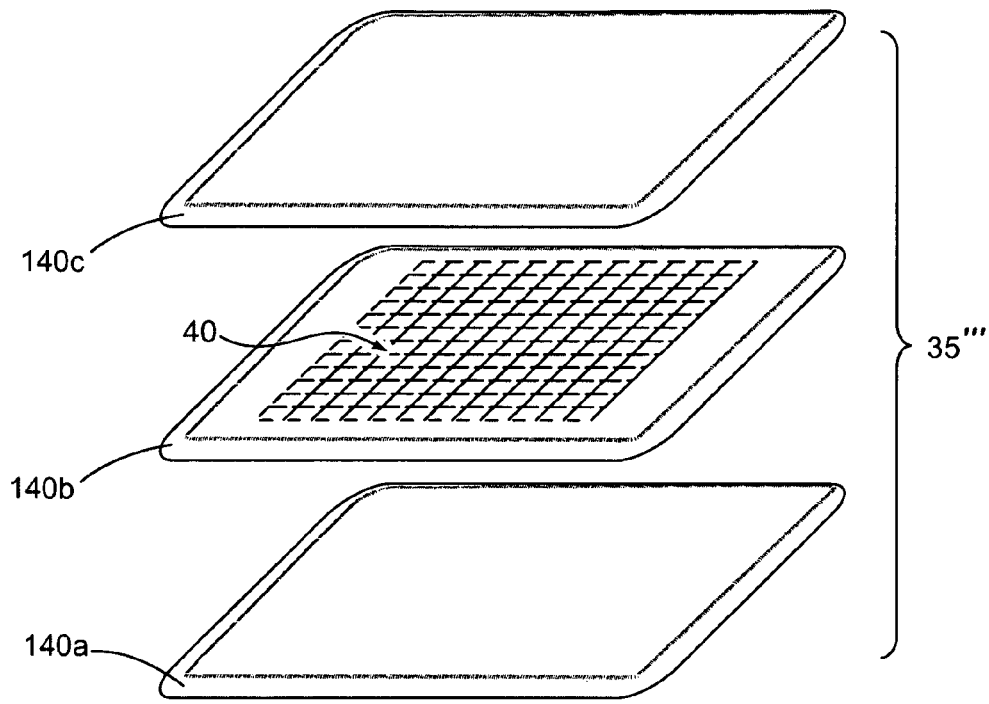
FIG. 9 is an exploded pictorial view of another alternate exemplary thermal interface material layer.

In another alternate exemplary embodiment depicted in FIG. 9, which is an exploded pictorial view, three preforms 140a, 140b and 140c may be stacked and a reflow performed to merge the three preforms 140a, 140b and 140c into a single thermal interface material layer 35'". The middle preform 140b may be pre-embedded with a support structure 40. By choosing the thicknesses of the various preforms 135a, 135b, 140a, 140b and 140c in FIGS. 8 and 9, it may be possible to select the vertical position of the support structure 40' or 40 as the case may be within the thermal interface material preform.

Figure 10:
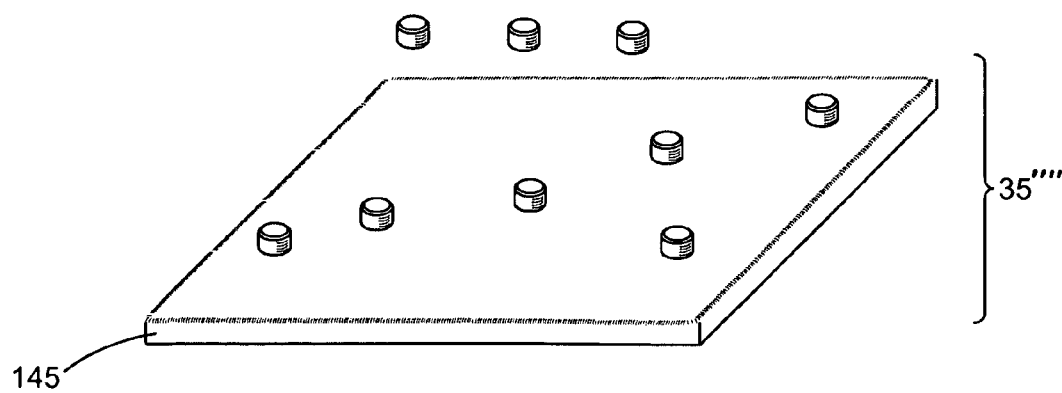
FIG. 10 is an exploded pictorial view of another alternate exemplary thermal interface material layer.

In another alternate exemplary embodiment depicted in FIG. 10, a thermal interface material layer 35"" may consist of a thermal interface material preform 145 embedded with a plurality of pillars 150. The pillars 150, shown exploded from the preform 145, may be composed of the same materials and spaced apart to form an array that serves the same general functions as the other embodiments disclosed herein. In lieu of inserting the pillars 150 into the preform 145, the preform 145 could be cast around the pillars 150. The same alternative embedding process could be used for the other support structures 40 and 40' disclosed herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a stack including a first semiconductor chip and a second semiconductor chip mounted on the first semiconductor chip, the first semiconductor chip having a first footprint and the second semiconductor chip having a second footprint smaller than the first footprint and a side facing away from the first semiconductor chip;
placing a support structure in a thermal interface material layer, the support structure having a third footprint larger than the second footprint; and
placing the thermal interface material layer on the side of the second semiconductor chip.

2. The method of claim 1, wherein the thermal interface material layer has a first thickness and the support structure has a second thickness less than the first thickness.

3. The method of claim 1, comprising mounting the stack on a semiconductor chip package substrate.

4. The method of claim 1, comprising reflowing the thermal interface material layer to wet both the first and second semiconductor chips.

5. The method of claim 1, wherein the placing a support structure comprises placing a mesh in the thermal interface material layer.

6. The method of claim 5, wherein the placing a support structure comprises placing a wire mesh in the thermal interface material layer.

7. The method of claim 1, comprising placing a heat spreader in thermal contact with the thermal interface material layer.

8. The method of claim 7, wherein the heat spreader comprises a lid.

9. A method of establishing thermal contact between a stack and a heat spreader, the stack including a first semiconductor chip, a second semiconductor chip mounted on the first semiconductor chip, the first semiconductor chip having a first footprint and the second semiconductor chip having a second footprint smaller than the first footprint and a side facing away from the first semiconductor chip, comprising:
placing a thermal interface material layer containing a support structure on the side of the second semiconductor chip;
placing the heat spreader proximate the thermal interface material layer; and
reflowing the thermal interface material layer to establish thermal contact with the first semiconductor chip, the second semiconductor chip and the heat spreader.

10. The method of claim 9, wherein the thermal interface material layer has a first thickness and the support structure has a second thickness less than the first thickness.

11. The method of claim 9, wherein the first semiconductor chip and the second semiconductor chip are mounted on a semiconductor chip package substrate.

12. The method of claim 9, wherein the support structure comprises a mesh.

13. The method of claim 12, wherein the mesh comprises a wire mesh.

14. The method of claim 9, wherein the heat spreader comprises a lid.

15. A method of manufacturing, comprising:
providing a stack including a first semiconductor chip and a second semiconductor chip mounted on the first semiconductor chip, the first semiconductor chip having a first footprint and the second semiconductor chip having a second footprint smaller than the first footprint;
placing a solder thermal interface material on the second semiconductor chip;
placing a support structure in the solder thermal interface material layer, the support structure having a third footprint larger than the second footprint;
placing a lid over the second semiconductor chip proximate the solder thermal interface material and reflowing the solder thermal interface material to wet the first semiconductor chip, the second semiconductor chip and the lid.

16. The method of claim 15, wherein the thermal interface material layer has a first thickness and the support structure has a second thickness less than the first thickness.

17. The method of claim 15, comprising coupling a semiconductor chip package substrate to the first semiconductor chip.

18. The method of claim 15, wherein the support structure comprises a mesh.

19. The method of claim 18, wherein the mesh comprises a wire mesh.

* * * * *